(12) United States Patent
Kobayashi

(10) Patent No.: US 9,831,674 B2
(45) Date of Patent: Nov. 28, 2017

(54) INFORMATION PROCESSING APPARATUS, INFORMATION PROCESSING SYSTEM, CONTROL METHOD OF INFORMATION PROCESSING SYSTEM, INFORMATION PROCESSING METHOD, AND INFORMATION PROCESSING PROGRAM

(71) Applicant: NEC Corporation, Tokyo (JP)

(72) Inventor: Yoshikazu Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 381 days.

(21) Appl. No.: 14/403,247

(22) PCT Filed: May 22, 2013

(86) PCT No.: PCT/JP2013/064239
§ 371 (c)(1),
(2) Date: Nov. 24, 2014

(87) PCT Pub. No.: WO2013/179986
PCT Pub. Date: Dec. 5, 2013

(65) Prior Publication Data
US 2015/0155715 A1   Jun. 4, 2015

(30) Foreign Application Priority Data

May 30, 2012   (JP) .................................. 2012-123805

(51) Int. Cl.
*H02J 3/32* (2006.01)
*H02J 7/35* (2006.01)
(Continued)

(52) U.S. Cl.
CPC ..... *H02J 3/32* (2013.01); *B60L 3/12* (2013.01); *B60L 11/184* (2013.01);
(Continued)

(58) Field of Classification Search
CPC ....... H02J 3/32; H02J 7/007; H02J 7/35; H02J 13/0006; B60L 11/1809; B60L 11/1816;
(Continued)

(56) References Cited

U.S. PATENT DOCUMENTS 6,104,160 A    8/2000 Iwata et al.
8,509,957 B2 *  8/2013 Tsuchiya ............. B60L 11/1862
                                    700/19
(Continued)

FOREIGN PATENT DOCUMENTS

EP    2056420 A1    5/2009
JP    2001-008380 A    1/2001
(Continued)

OTHER PUBLICATIONS

English translation of Japanese patent JP 2002-315193-A, (Oct. 25, 2002), downloaded Feb. 10, 2017, 22 pages.*
(Continued)

*Primary Examiner* — Hal Kaplan
(74) *Attorney, Agent, or Firm* — Wilmer Cutler Pickering Hale and Dorr LLP

(57) ABSTRACT

An information processing system includes a controller that controls the supply route of electric power in a house, a determining unit that determines, based on the driving schedule of an electric vehicle, necessary energy with which the car battery of the electric vehicle should be charged, and a detector that detects first charge energy with which the car battery is charged. The controller selects, based on the necessary energy and the first charge energy, which one of electric power supplied from a power company and electric power supplied from the car battery is to be consumed in the house.

11 Claims, 23 Drawing Sheets

(51) Int. Cl.

| | |
|---|---|
| *B60L 11/18* | (2006.01) |
| *B60L 3/12* | (2006.01) |
| *G01R 21/133* | (2006.01) |
| *H02J 7/00* | (2006.01) |
| *H02J 13/00* | (2006.01) |
| *H01M 10/48* | (2006.01) |

(52) U.S. Cl.
CPC ....... *B60L 11/1809* (2013.01); *B60L 11/1816* (2013.01); *B60L 11/1824* (2013.01); *B60L 11/1842* (2013.01); *B60L 11/1844* (2013.01); *B60L 11/1861* (2013.01); *G01R 21/133* (2013.01); *H02J 7/007* (2013.01); *H02J 7/35* (2013.01); *H02J 13/0006* (2013.01); *B60L 2230/22* (2013.01); *B60L 2230/30* (2013.01); *B60L 2230/40* (2013.01); *B60L 2240/662* (2013.01); *B60L 2240/70* (2013.01); *B60L 2240/80* (2013.01); *B60L 2260/50* (2013.01); *B60L 2260/52* (2013.01); *B60L 2260/54* (2013.01); *B60L 2260/58* (2013.01); *H01M 10/48* (2013.01); *H01M 2220/10* (2013.01); *H01M 2220/20* (2013.01); *Y02E 60/721* (2013.01); *Y02T 10/705* (2013.01); *Y02T 10/7005* (2013.01); *Y02T 10/7044* (2013.01); *Y02T 10/7088* (2013.01); *Y02T 10/7291* (2013.01); *Y02T 90/121* (2013.01); *Y02T 90/128* (2013.01); *Y02T 90/14* (2013.01); *Y02T 90/16* (2013.01); *Y02T 90/163* (2013.01); *Y02T 90/168* (2013.01); *Y02T 90/169* (2013.01); *Y04S 10/126* (2013.01); *Y04S 30/12* (2013.01); *Y04S 30/14* (2013.01); *Y10T 307/352* (2015.04)

(58) Field of Classification Search
CPC B60L 11/1824; B60L 11/184; B60L 11/1842; B60L 11/1844; B60L 11/1861; B60L 2230/22; B60L 2230/30; B60L 2230/40; B60L 2240/662; B60L 2240/70; B60L 2240/80; B60L 2260/50; B60L 2260/52; B60L 2260/54; B60L 2260/58; G01R 21/133; Y10T 307/352; H01M 10/48; H01M 2220/10; H01M 2220/20; Y02E 60/721; Y02T 10/7005; Y02T 10/7044; Y02T 10/705; Y02T 10/7088; Y02T 10/7291; Y02T 90/121; Y02T 90/128; Y02T 90/14; Y02T 90/16; Y02T 90/163; Y02T 90/168; Y02T 90/169; Y04S 10/126; Y04S 30/12; Y04S 30/14

USPC ......................................................... 307/24
See application file for complete search history.

(56) References Cited

U.S. PATENT DOCUMENTS

| | | |
|---|---|---|
| 9,041,348 B2 | 5/2015 | Murawaka |
| 2009/0192655 A1 | 7/2009 | Ichikawa et al. |
| 2010/0017045 A1 | 1/2010 | Nesler et al. |
| 2011/0156651 A1 | 6/2011 | Christensen |
| 2012/0016546 A1* | 1/2012 | Nilssen ................... H02J 9/062 701/22 |
| 2012/0187900 A1 | 7/2012 | Murawaka |

FOREIGN PATENT DOCUMENTS

| | | |
|---|---|---|
| JP | 2002-315193 A | 10/2002 |
| JP | 2011-130647 A | 6/2011 |
| JP | 2012-023955 A | 2/2012 |
| WO | WO-2010/042550 A2 | 4/2010 |
| WO | WO-2011/024067 A2 | 3/2011 |

OTHER PUBLICATIONS

Extended European Search Report issued by the European Patent Office for Application No. 13796691.7 dated Jun. 9, 2016 (8 pages).
Japanese Office Action issued by the Japan Patent Office for Application No. 2012-123805 dated May 23, 2016 (3 pages).
International Search Report corresponding to PCT/JP2013/064239, dated Aug. 6, 2013 (3 pages).

* cited by examiner

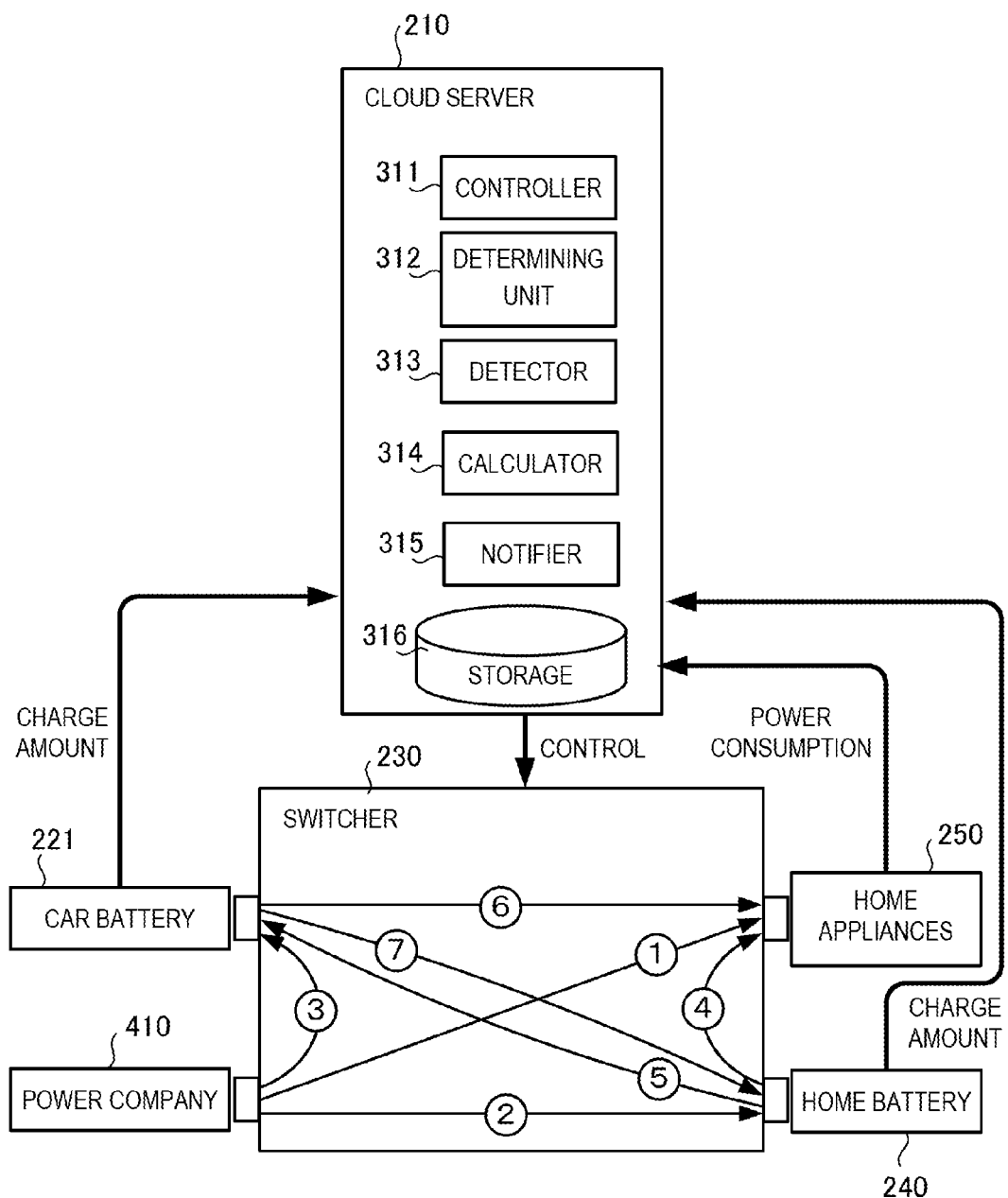
F I G. 5

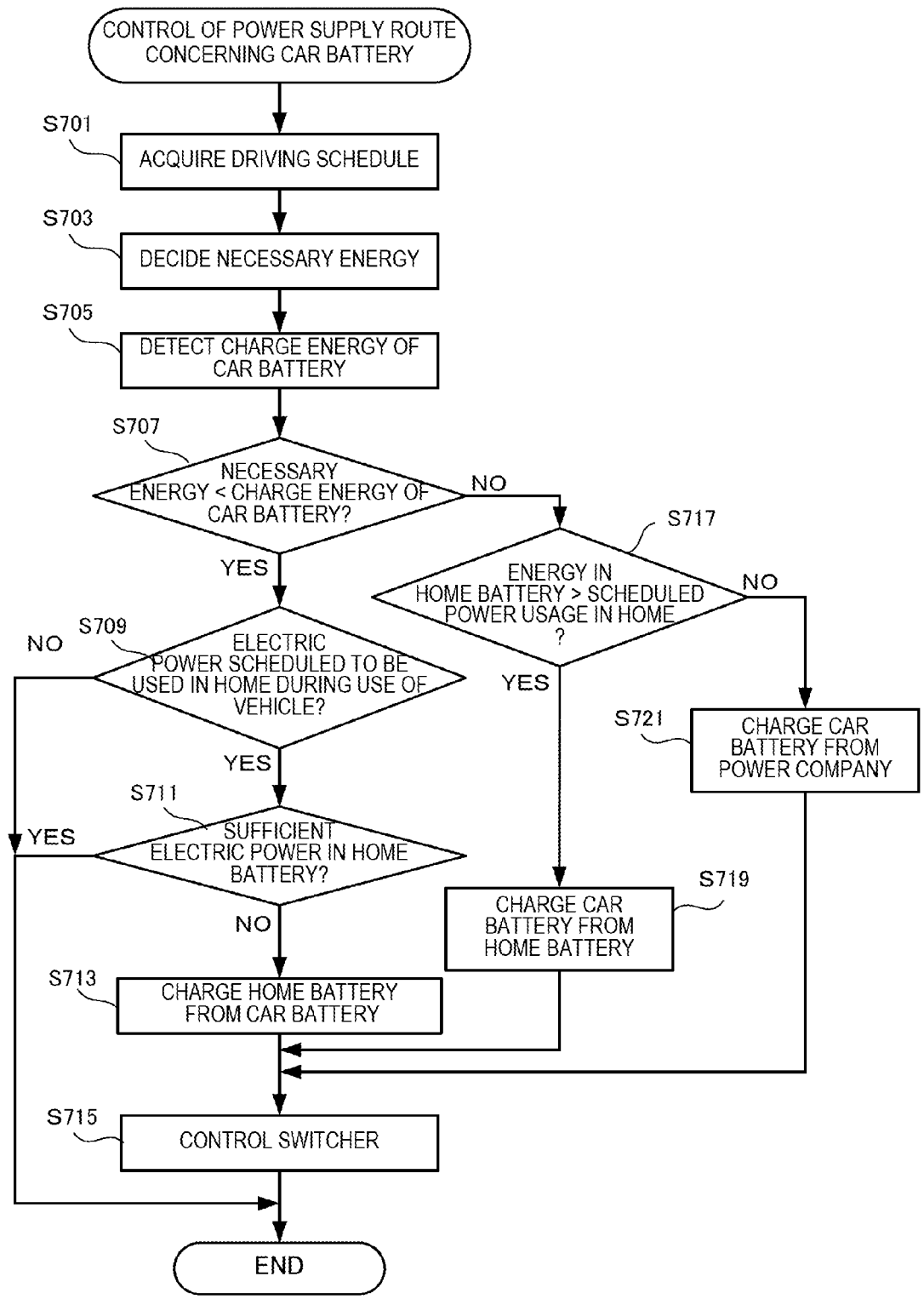
F I G. 7A

| DATE | ACTION STATUS | SEASON | DAY OF WEEK | WEATHER | AVERAGE TEMPERATURE (°C) | POWER CONSUMPTION (KWh) |
|---|---|---|---|---|---|---|
| 2012/07/14 | ONE PERSON AT HOME | SUMMER | SATURDAY | RAIN | 24.1 | 8.5 |
| 2012/07/15 | OUT OF HOME | SUMMER | SUNDAY | FINE | 26.0 | 4.0 |
| ... | ... | ... | ... | ... | ... | ... |
| ... | ... | ... | ... | ... | ... | ... |
| ... | ... | ... | ... | ... | ... | ... |
| ... | ... | ... | ... | ... | ... | ... |

FIG. 7B

| LIFE STYLE | COMMUTING STYLE | POWER CONSUMPTION GROUP |
|---|---|---|
| DOUBLE-INCOME FAMILY | TRAIN/TRAIN | 1 |
| | VEHICLE/VEHICLE | 2 |
| | VEHICLE/TRAIN | 3 |
| | VEHICLE/WORK AT HOME | 4 |
| | TRAIN/WORK AT HOME | 5 |
| SINGLE-INCOME FAMILY | TRAIN | 6 |
| | VEHICLE | 7 |
| | WORK AT HOME | 8 |

810

F I G. 8

| POWER CONSUMPTION GROUP | WEEKDAY | | | |
|---|---|---|---|---|
| | NIGHT | MORNING | DAYTIME | EVENING |
| 1 | CHARGE HOME BATTERY | USE HOME BATTERY | NO POWER CONSUMPTION | USE HOME BATTERY |
| 2 | CHARGE CAR BATTERY / CHARGE HOME BATTERY | USE HOME BATTERY | NO POWER CONSUMPTION | USE CAR BATTERY / USE HOME BATTERY |
| 3 | CHARGE CAR BATTERY / CHARGE HOME BATTERY | USE HOME BATTERY | USE HOME BATTERY | USE CAR BATTERY / USE HOME BATTERY |
| 4 | | USE HOME BATTERY | | |
| 5 | CHARGE HOME BATTERY | USE HOME BATTERY | | USE HOME BATTERY |

FIG. 9A

| POWER CONSUMPTION GROUP | WEEKDAY | | | |
| --- | --- | --- | --- | --- |
| | NIGHT | MORNING | DAYTIME | EVENING |
| 6 | CHARGE HOME BATTERY | USE HOME BATTERY | USE HOME BATTERY | USE HOME BATTERY → USE EXTERNAL ELECTRIC POWER |
| 7 | CHARGE CAR BATTERY → CHARGE HOME BATTERY | USE HOME BATTERY | USE HOME BATTERY | USE CAR BATTERY → USE HOME BATTERY |
| 8 | CHARGE HOME BATTERY | USE HOME BATTERY | | |

930

F I G. 9C

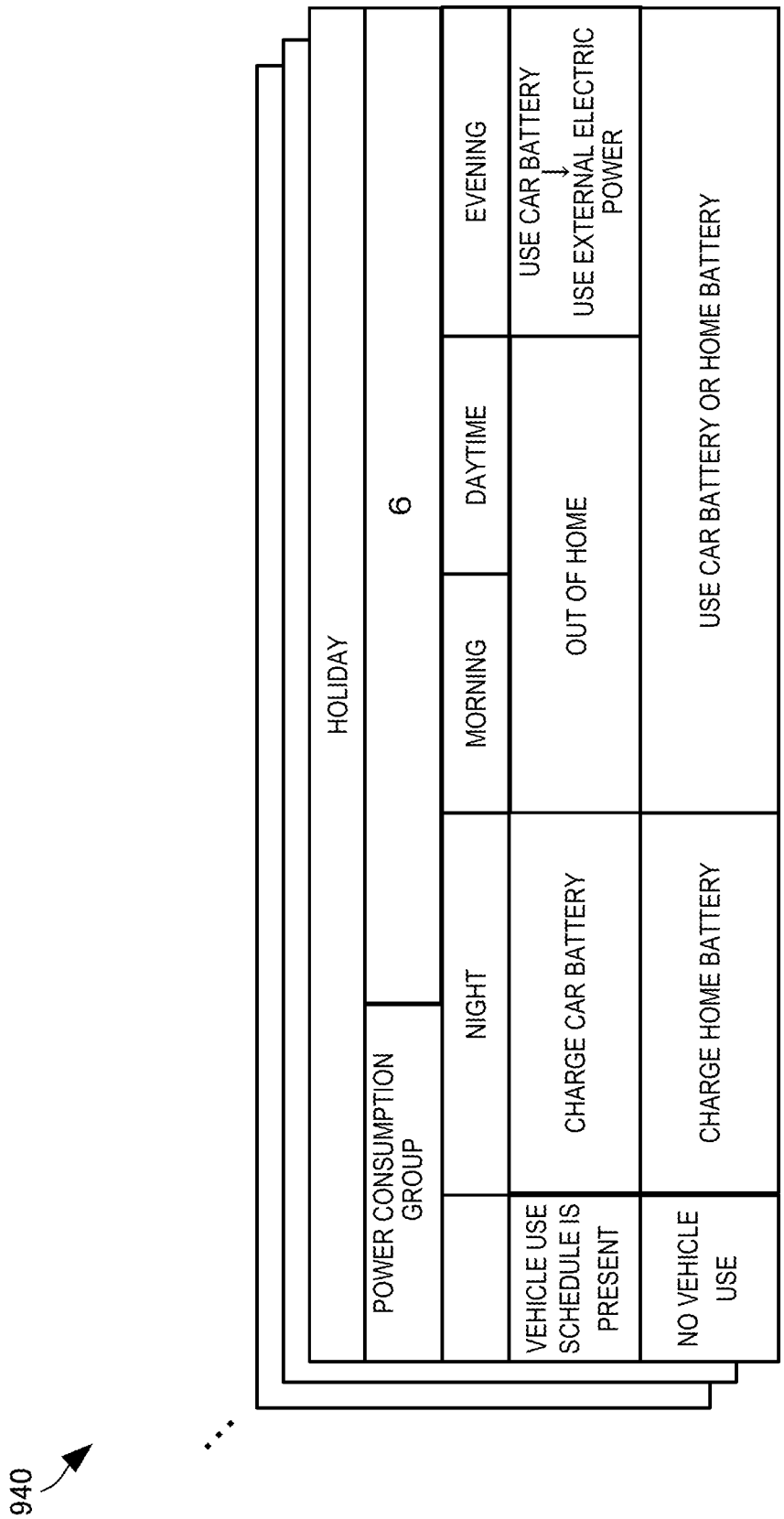

950

| MODEL | DRIVING ENVIRONMENT | MILEAGE |
|---|---|---|
| KATO EV 2012 | EXPRESSWAY | 7km/kwh |
| ⋮ | ⋮ | ⋮ |
| ⋮ | ⋮ | ⋮ |
| ⋮ | ⋮ | ⋮ |

F I G. 9E

| MODEL | FIRST YEAR | SECOND YEAR | THIRD YEAR |
|---|---|---|---|
| A | 3.5km/kWh | 3.4km/kWh | 3.4km/kWh |
| B | 2.4km/kWh | 2.2km/kWh | 2.2km/kWh |
| C | 1.5km/kWh | 1.2km/kWh | 1.0km/kWh |

FIG. 13

| DRIVER | MILEAGE |
|--------|---------|
| FATHER | 3.5km/kWh |
| MOTHER | 4km/kWh |
| SON | 3.2km/kWh |

F I G. 14

INFORMATION PROCESSING APPARATUS, INFORMATION PROCESSING SYSTEM, CONTROL METHOD OF INFORMATION PROCESSING SYSTEM, INFORMATION PROCESSING METHOD, AND INFORMATION PROCESSING PROGRAM

CROSS-REFERENCE TO RELATED APPLICATIONS

This application is a national stage application of International Application No. PCT/JP2013/064239 entitled "INFORMATION PROCESSING APPARATUS, INFORMATION PROCESSING SYSTEM, CONTROL METHOD OF INFORMATION PROCESSING SYSTEM, INFORMATION PROCESSING METHOD, AND INFORMATION PROCESSING PROGRAM," filed on May 22, 2013, which claims the benefit of the priority of Japanese Patent Application No. 2012-123805, filed on May 30, 2012, the disclosures of each of which are hereby incorporated by reference in their entirety.

TECHNICAL FIELD

The present invention relates to a technique for using the battery of an electric vehicle.

BACKGROUND ART

In the above technical field, patent literature 1 discloses a technique related to a system capable of mutually transmitting electric power between an electric vehicle and a residence.

CITATION LIST

Patent Literature

Patent literature 1: Japanese Patent Laid-Open No. 2001-8380

SUMMARY OF THE INVENTION

Technical Problem

In the technique described in the above-described literature, however, a user's action is not predicted, and electricity cannot efficiently be used.

The present invention enables to provide a technique of solving the above-described problem.

Solution to Problems

One aspect of the present invention provides an apparatus comprising:
  a controller that controls a supply route of electric power in a house;
  a determining unit that determines, based on a driving schedule of an electric vehicle, necessary energy with which a car battery of the electric vehicle should be charged; and
  a detector that detects first charge energy with which the car battery is charged,
  wherein the controller selects, based on the necessary energy and the first charge energy, which one of electric power supplied from a power company and electric power supplied from the car battery is to be consumed in the house.

Another aspect of the present invention provides a method comprising:
  determining, based on a driving schedule of an electric vehicle, necessary energy with which a car battery should be charged;
  detecting first charge energy with which the car battery is charged; and
  controlling a supply route of electric power in house by selecting, based on the necessary energy and the first charge energy, which one of electric power supplied from a power company and electric power supplied from the car battery of the electric vehicle is to be consumed in the house.

Still other aspect of the present invention provides a program that causes a computer to execute a method comprising:
  determining, based on a driving schedule of an electric vehicle, necessary energy with which a car battery should be charged;
  detecting first charge energy with which the car battery is charged; and
  controlling a supply route of electric power in house by selecting, based on the necessary energy and the first charge energy, which one of electric power supplied from a power company and electric power supplied from the car battery of the electric vehicle is to be consumed in the house.

Still other aspect of the present invention provides an information processing system comprising:
  a switching apparatus that is installed in a house and switches a supply route of electric power to be consumed in the house to one of a car battery of an electric vehicle and outside of the house; and
  an information processing apparatus,
  the information processing apparatus comprising:
  a determining unit that determines, based on a driving schedule of the electric vehicle, necessary energy with which the car battery should be charged;
  a detector that detects first charge energy with which the car battery is charged;
  a calculator that calculates surplus energy in the car battery based on a difference between the first charge energy and the necessary energy; and
  a controller that selects, based on the necessary energy and the first charge energy, which one of electric power corresponding to the surplus energy supplied from the car battery and electric power supplied from the outside of the house is to be consumed in the house and controls the supply route of the electric power in house.

Still other aspect of the present invention provides a control method of an information processing system, the method comprising:
  determining, based on a driving schedule of an electric vehicle, necessary energy with which a car battery should be charged;
  detecting first charge energy with which the car battery is charged;
  calculating surplus energy in the car battery based on a difference between the first charge energy and the necessary energy; and
  controlling a supply route of electric power by selecting, based on the surplus energy, which one of electric power corresponding to the surplus energy supplied from the car battery and electric power supplied from outside of a house is to be consumed in the house and controlling a switching apparatus installed in the house.

Advantageous Effects of Invention

According to the present invention, it is possible to predict a user's action and efficiently use electricity.

BRIEF DESCRIPTION OF THE DRAWINGS

FIG. 5 is a view showing the supply route of the switcher according to the second embodiment of the present invention;

FIG. 7A is a flowchart showing the procedure of processing of the cloud server according to the second embodiment of the present invention;

FIG. 7B is a table showing power consumption corresponding to each action status according to the second embodiment of the present invention;

FIG. 8 is a table showing power consumption groups according to the second embodiment of the present invention;

FIG. 9A is a table showing power consumption and charge models according to the second embodiment of the present invention;

FIG. 9C is a table showing power consumption and charge models according to the second embodiment of the present invention;

FIG. 9D is a table showing power consumption and charge models according to the second embodiment of the present invention;

FIG. 9E is a table showing information about the battery consumption of an electric vehicle of the same model according to the second embodiment of the present invention;

FIG. 13 is a table showing the mileage data of each model according to the third embodiment of the present invention; and FIG. 14 is a table showing the mileage data of each driver according to the third embodiment of the present invention.

DESCRIPTION OF THE EMBODIMENTS

Preferred embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

First Embodiment

An information processing apparatus 100 according to the first embodiment of the present invention will be described with reference to FIG. 1. The information processing apparatus 100 is an apparatus used to efficiently use the electric power of the battery of an electric vehicle.

Figure 1:
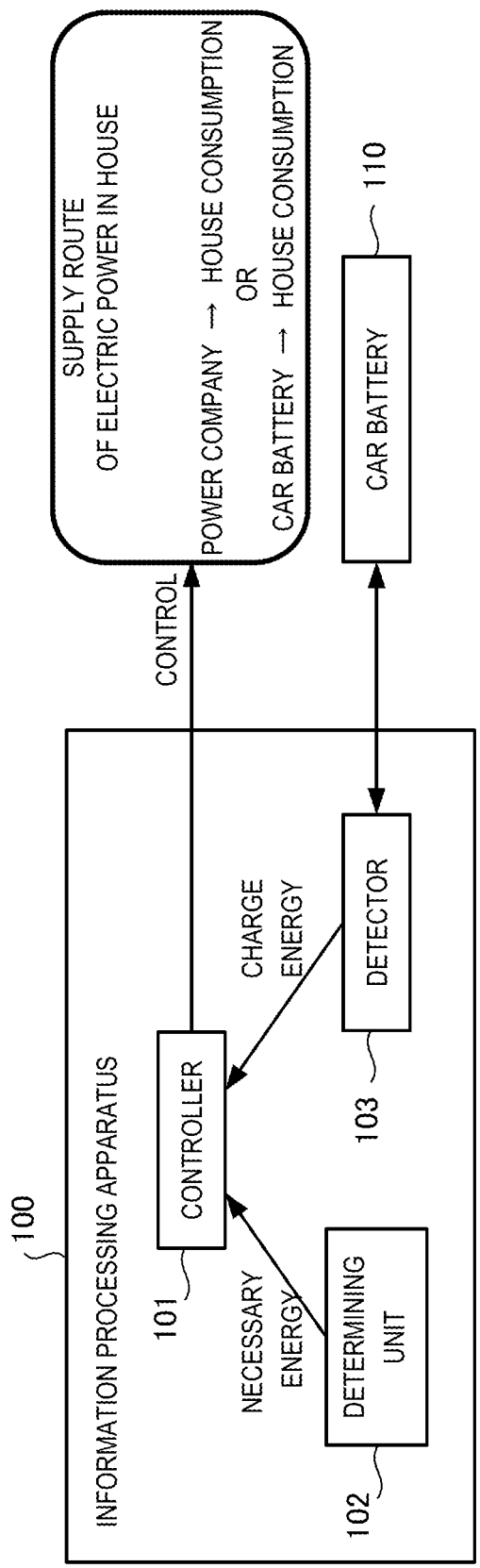
FIG. 1 is a block diagram showing the arrangement of an information processing apparatus according to the first embodiment of the present invention.

As shown in FIG. 1, the information processing apparatus 100 includes a controller 101, a determining unit 102, and a detector 103.

The controller 101 controls the supply route of electric power in a house. The determining unit 102 determines, based on the driving schedule of the electric vehicle, necessary energy with which a car battery 110 of the electric vehicle should be charged. The detector 103 detects charge energy with which the car battery 110 is charged. The controller 101 selects, based on the necessary energy and the charge energy, which one of electric power supplied from a power company and electric power supplied from the car battery 110 is to be consumed in the house.

With the above arrangement and operation, the information processing apparatus according to this embodiment can efficiently use electric power by controlling power supply in accordance with a user's action schedule.

Second Embodiment

Figure 2:
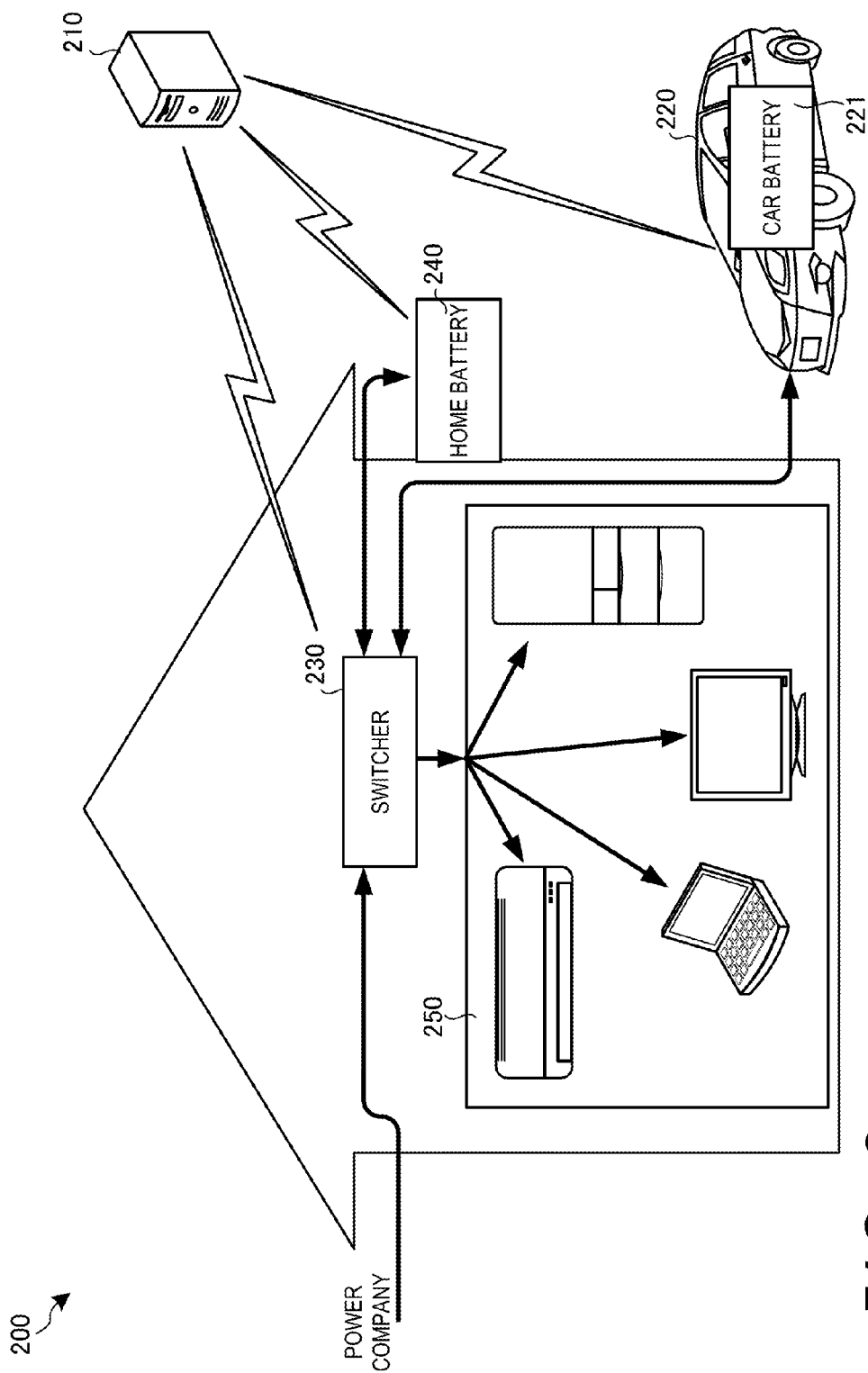
FIG. 2 is a view showing the outline of an information processing system including a cloud server according to the second embodiment of the present invention.

An information processing system 200 including a cloud server according to the second embodiment of the present invention will be described next with reference to FIG. 2. FIG. 2 is a view for explaining the outline of the information processing system 200 according to this embodiment.

(Outline of Information Processing System)

As shown in FIG. 2, the information processing system 200 includes a cloud server 210 that is an example of an information processing apparatus, an electric vehicle 220, a switcher 230, and a home battery 240. Note that the switcher 230 and the home battery 240 are installed in a home.

The cloud server 210 detects charge energy with which a car battery 221 on board of the electric vehicle 220 is charged.

The cloud server 210 determines, based on the driving schedule of the electric vehicle 220, necessary energy with which the car battery of the electric vehicle should be charged. The cloud server 210 controls the switcher 230 based on the detected charge energy and the determined necessary energy, and consequently controls the supply route of electric power in the home.

(Arrangement of Cloud Server 210)

Figure 3A:
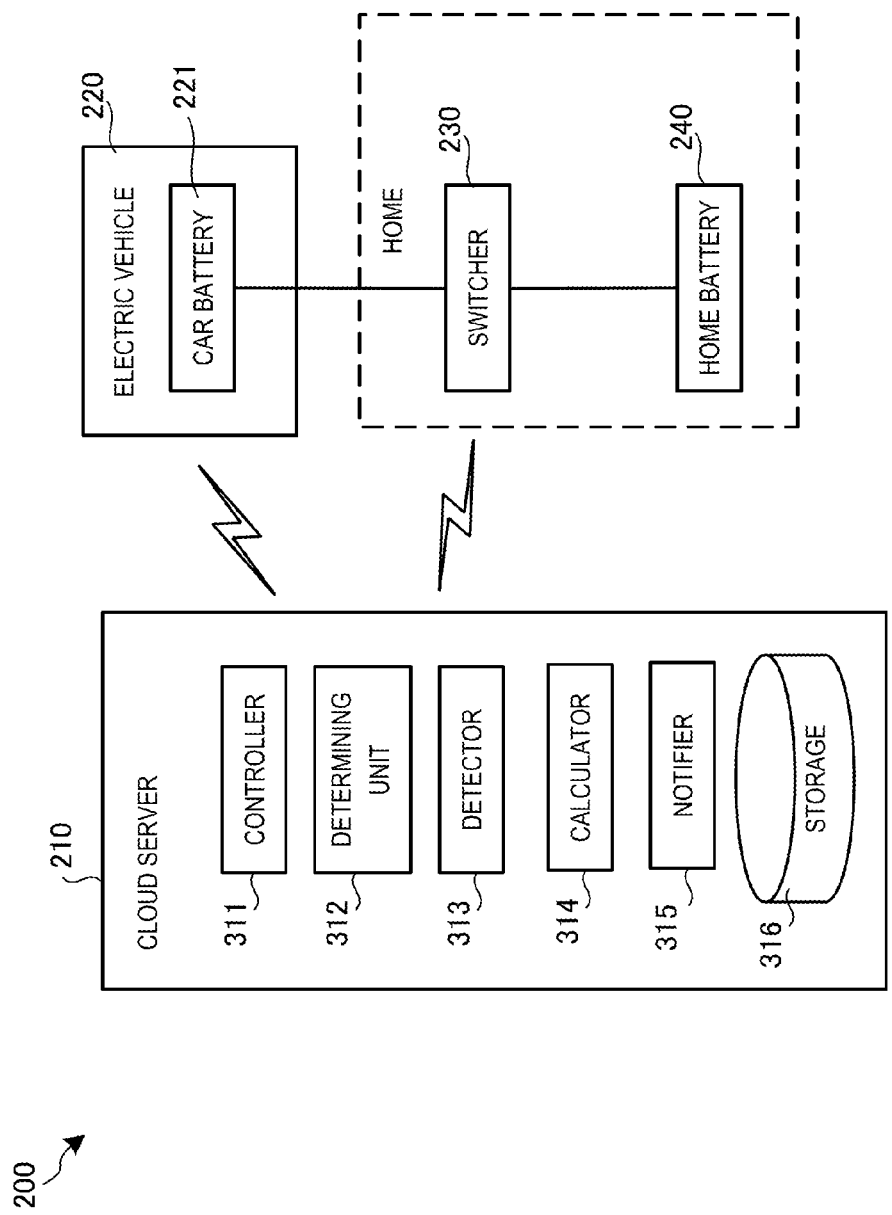
FIG. 3A is a block diagram showing the arrangement of the information processing system including the cloud server according to the second embodiment of the present invention.
Figure 3B:
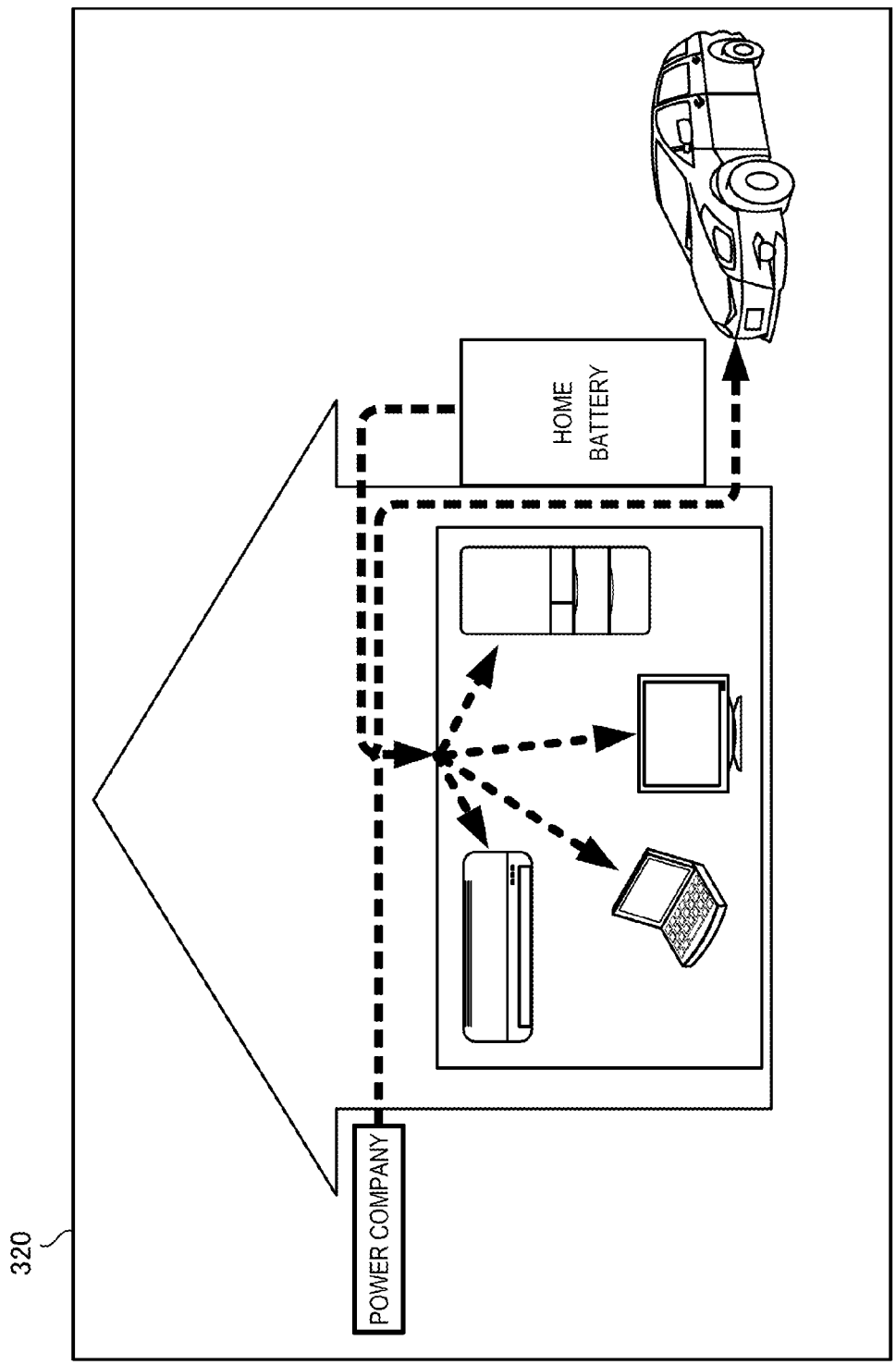
FIG. 3B is a view showing the notification contents of a notifier according to the second embodiment of the present invention.
Figure 3C:
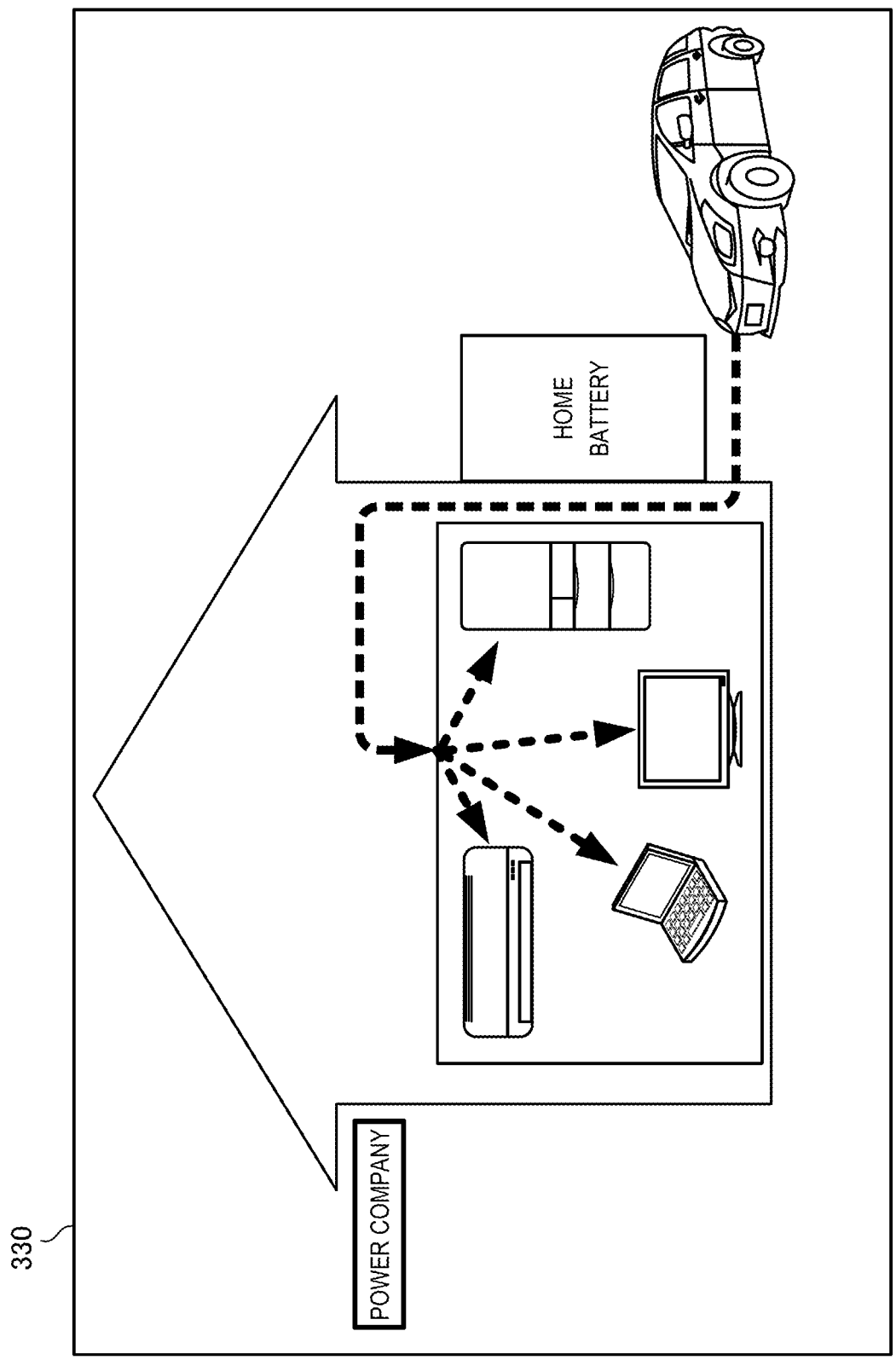
FIG. 3C is a view showing the notification contents of the notifier according to the second embodiment of the present invention.

FIGS. 3A to 3C are views for explaining the information processing system 200 including the cloud server 210 according to this embodiment. FIG. 3A is a block diagram showing the arrangement of the cloud server 210.

The cloud server 210 is formed from a controller 311, a determining unit 312, a detector 313, a calculator 314, a notifier 315, and a storage 316. The cloud server 210 is communicably connected to the electric vehicle 220 and the switcher 230. The switcher 230 and the home battery 240 serving as a house battery are installed in the home. The switcher 230 switches the supply route of electric power in the home under the control of the controller 311.

Based on the driving schedule of the electric vehicle 220, the determining unit 312 determines necessary energy with which the car battery 221 should be charged. Here, the driving schedule of the electric vehicle 220 is determined based on, for example, user's schedule information stored in the storage 316 of the cloud server 210. The cloud server 210 accepts input of user's schedule information from a user terminal (personal computer, portable telephone, smartphone, tablet or the like used by the user).

The determining unit 312 also determines a predicted home power consumption (predicted house power consumption) based on an action schedule in the home. The determining unit 312 predicts energy necessary to use home appliances 250 installed in the home based on the past power consumption of the home appliances 250. The past power consumption of the home appliances 250 is stored in the storage 316 as knowledge for each user. The storage 316 stores, for example, a date, season, day of week, weather, temperature, humidity, event, at or out of home, number of persons at home, and the like every day together with the power consumption. The determining unit 312 determines the predicted home power consumption based on the past home power consumption and its attribute stored in the storage 316 and the action schedule in the home. The action schedule in the home can be derived based on a life pattern stored in the storage 316 as well as schedule information registered in advance by the user.

The detector 313 detects charge energy with which the car battery 221 is charged. The detector 313 also detects home battery charge energy with which the home battery 240 is charged.

The calculator 314 calculates surplus energy in the car battery based on the difference between the charge energy and the necessary energy of the car battery 221.

The controller 311 controls the switcher 230 based on the detected charge energy and the determined necessary energy, and consequently controls the supply route of electric power in the home. More specifically, the controller 311 selects, based on the necessary energy and the charge energy of the car battery 221, which one of electric power purchased from a power company and electric power supplied from the car battery 221 is to be consumed in the home. For example, when the car battery 221 has surplus energy, the controller 311 selects supplying the surplus energy to the home appliances 250 without purchasing electric power from the power company. If the predicted home power consumption is equal to or less than a predetermined amount, the controller 311 selects leaving the energy in the car battery 221 even when it has surplus energy.

The notifier 315 notifies the user of the supply route of electric power supplied from the car battery 221 or the home battery 240.

The storage 316 stores, as knowledge, the usage and supply route of electric power in the home based on user's schedule information and life style.

FIGS. 3B and 3C are views showing examples of a notification screen (energy monitor) generated by the notifier 315. Notification screens 320 and 330 are displayed on, for example, a display provided on the switcher 230. By user setting in the cloud server 210, the notification screens 320 and 330 may be displayed on the display of a smart device or portable phone owned by the user.

The notification screen 320 represents that electric power supplied from the power company is used to charge the car battery, whereas electric power from the home battery 240 is supplied to the home appliances 250.

The notification screen 330 represents that neither electric power supplied from the power company nor electric power stored in the home battery 240 is used, and electric power is supplied from the car battery 221 to the home appliances 250.

This notification allows the user to grasp the energy flow at a glance.

(Operation of Switcher)

Figure 4:
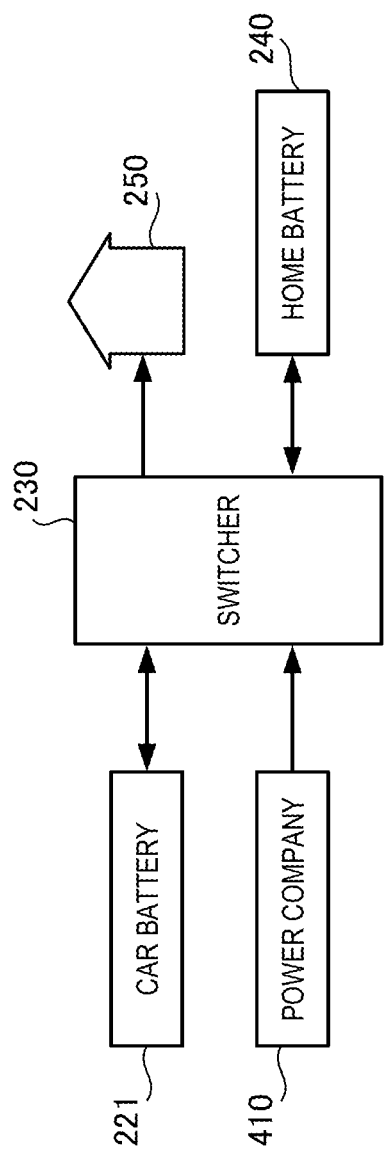
FIG. 4 is a view showing modeling of the switcher of the information processing system including the cloud server according to the second embodiment of the present invention.

The switcher 230 will be described with reference to FIGS. 4 and 5. FIG. 4 is a model diagram showing the switching target of the switcher 230. FIG. 5 is a view for explaining details of switching by the switcher 230.

The switcher 230 switches the supply route of electric power among a power company 410, the car battery 221, the home battery 240, and the home appliances 250. The power company 410 is fixed as a supply source, and the home appliances 250 are fixed as a supply destination. The car battery 221 and the home battery 240 can be both a supply source and a supply destination.

As shown in FIG. 5, the switcher 230 has seven supply routes (1) to (7) and performs switching so as to select at least one of them. The supply route (1) is used to consume, in the home, electric power supplied from the power company 410. The supply route (2) is used to charge the home battery 240 with electric power supplied from the power company 410. The supply route (3) is used to charge the car battery 221 with electric power supplied from the power company 410. The supply route (4) is used to consume, in the home, electric power supplied from the home battery 240. The supply route (5) is used to charge the car battery 221 with electric power supplied from the home battery 240. The supply route (6) is used to consume, in the home, electric power supplied from the car battery 221. The supply route (7) is used to charge the home battery 240 with electric power supplied from the car battery 221. Note that since the electricity rate of electric power supplied from the power company 410 is lower at night than in the daytime, the home battery 240 is preferably charged with the electric power supplied from the power company 410 at night.

The supply route (1) is selected, for example, during driving of the electric vehicle 220 in a state in which the home battery 240 is not charged with electric power, and the home appliances 250 need to be used.

The supply route (2) is selected, for example, at night in a state in which the home battery 240 is not charged with electric power, and the home appliances 250 are scheduled to be used in the next day.

The supply route (3) is selected, for example, at night in a state in which the car battery 221 is not charged with electric power, and the electric vehicle 220 is scheduled to be used in the next day.

The supply route (4) is selected, for example, in the daytime in a state in which the home battery 240 is charged with electric power, and the home appliances 250 need to be used.

The supply route (5) is selected, for example, at night in a state in which the home battery 240 is charged with electric power, the home appliances 250 are not scheduled to be used, and the electric vehicle 220 is scheduled to be used in the next day.

The supply route (6) is selected, for example, in the daytime in a state in which the electric vehicle 220 is not scheduled to be used, the home battery 240 is not charged with electric power, and the home appliances 250 need to be used.

The supply route (7) is selected, for example, in a state in which the electric vehicle 220 is scheduled to be used but not driven until battery exhaustion, and electric power is scheduled to be used even in the home during use of the electric vehicle 220.

Note that the determining unit 312 of the cloud server 210 acquires a consumption data of power which are supplied to the home appliances 250 via the supply routes (1), (4), and (6). The determining unit 312 accumulates it together with the state (day of week, weather, and the like), thereby determining the predicted power consumption in the home.

(Procedure of Processing of Information Processing System 200)

Figure 6:
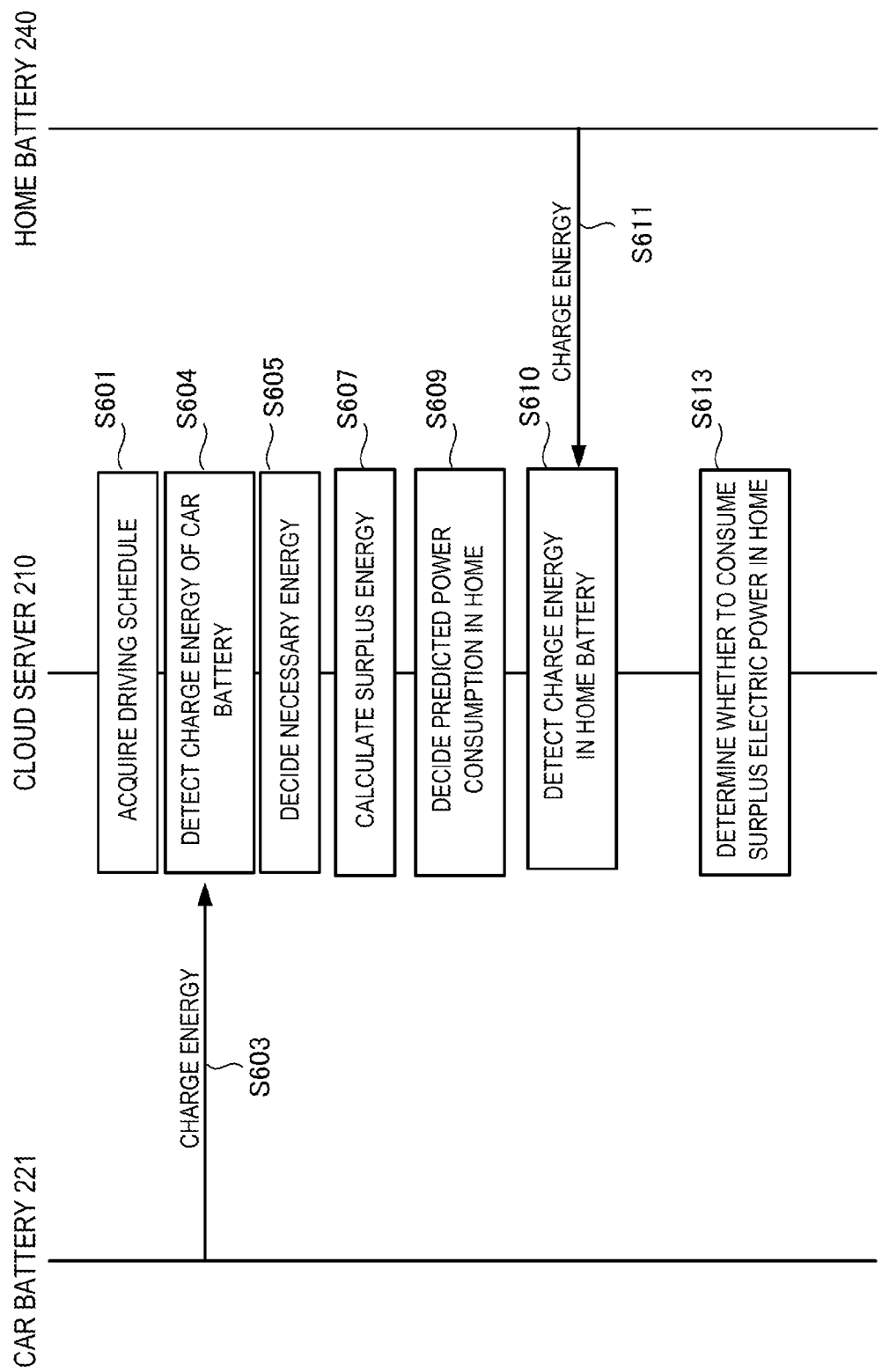
FIG. 6 is a sequence chart showing the procedure of processing of the information processing system according to the second embodiment of the present invention.

The procedure of processing of the information processing system 200 will be described with reference to the sequence chart of FIG. 6.

In step S601, the cloud server 210 acquires the driving schedule of the electric vehicle 220 from schedule information registered in the storage 316 in advance, or the like.

In step S604, the detector 313 of the cloud server 210 detects the charge energy of the car battery with which the car battery 221 is charged.

Additionally, in step S605, the determining unit 312 of the cloud 30 server 210 determines, based on the driving schedule, necessary energy with which the car battery 221 should be charged.

In step S607, the calculator 314 of the cloud server 210 calculates the surplus energy in the car battery 221 based on the difference between the charge energy and the necessary energy of the car battery.

In step S609, the determining unit 312 of the cloud server 210 determines the predicted home power consumption based on the action schedule in the home.

In step S610, the detector 313 detects the charge energy of the home battery with which the home battery 240 is charged.

In step S613, the controller 311 determines whether to consume the surplus energy in the home.

(Procedure of Processing of Cloud Server)

FIG. 7A is a flowchart showing the procedure of processing of the cloud server 210. FIG. 7B is a table showing a user's action status.

In step S701, the cloud server 210 acquires the driving schedule of the electric vehicle 220. In step S703, the determining unit 312 determines the necessary energy of the car battery 221 based on the driving schedule. In step S705, the detector 313 detects the charge energy of the car battery 221. In step S707, the controller 311 compares the necessary energy with the charge energy of the car battery and determines whether the charge energy of the car battery is larger, that is, surplus energy exists in the car battery 221.

Upon determining in step S707 that surplus energy exists, the process advances to step S709 to determine whether the electric vehicle 220 is scheduled to be used, and the home appliances 250 are scheduled to use electric power during use of the electric vehicle 220. If no electric power is scheduled to be used in the home, the electric vehicle 220 can be used while keeping the surplus energy unused. Hence, the processing ends.

Upon determining in step S709 that the electric vehicle 220 is scheduled to be used, and the home appliances 250 are scheduled to use electric power in a predetermined amount or more during use of the electric vehicle 220, the process advances to step S711 to determine whether the home battery 240 has electric power equal to or more than the predetermined amount. If the home battery 240 has electric power equal to or more than the predetermined amount, the electric vehicle 220 can be used while keeping the surplus energy unused. Hence, the processing ends. That is, when the predicted home power consumption is equal to or less than the predetermined amount, the surplus energy in the car battery 221 is not supplied to the home battery 240.

Upon determining in S711 that the home battery 240 is not charged with electric power equal to or more than the predetermined amount, the process advances to step S713 to determine to supply electric power from the car battery 221 to the home battery 240.

Upon determining in step S707 that no surplus energy exists in the car battery 221, the process advances to step S717 to determine whether the charge energy with which the home battery 240 is charged is larger than the scheduled power usage in the home. If the charge energy with which the home battery 240 is charged is larger than the scheduled power usage in the home, the process advances to step S719 to determine to supply electric power corresponding to the surplus energy of the home battery 240 from the home battery 240 to the car battery 221.

If the charge energy with which the home battery 240 is charged is smaller than the scheduled power usage in the home, the process advances to step S721 to determine to directly charge the car battery 221 using electric power supplied from the power company.

The process advances from step S713, S719, or S721 to step S715 to control the switcher 230 in the home so as to select the determined power supply route.

FIG. 7B is a table showing power consumption (KWh) corresponding to each user's action status. FIG. 7B shows a table 750 that stores a date, season, day of week, weather, and average temperature (° C.). The action statuses are classified on a date basis into, for example, going out, one person at home, . . . , by going out, going out, and the number of persons at home. In addition, a date, season, day of week, weather, and average temperature (° C.) are included as attributes to be used when obtaining a power consumption.

The determining unit 312 obtains a past power consumption based on the same action status and predicts, based on the past power consumption of the home appliances 250, energy necessary to use the home appliances 250 installed in the home.

(Table of Life Style)

FIG. 8 is a view showing a table that classifies users into power consumption groups based on predetermined life styles. Tables shown in FIGS. 9A to 9D represent the power consumption models of the power consumption groups shown in FIG. 8 and charge models to the batteries. Note that these tables are stored in the storage 316 of the cloud server 210 as knowledge about user's power usage in the home and the charge models.

By referring to the tables shown in FIGS. 8 and 9A to 9E stored in the storage 316, the controller 311 controls the switcher 230 to control power supply of the car battery 221, the home battery 240, the home appliances 250, and the power company 410.

As shown in FIG. 8, when both the husband and wife take trains to commute to and from work, the user is classified into power consumption group 1. When both take an electric vehicle to commute, the user is classified into power consumption group 2. When only one of them commutes by an electric vehicle, the user is classified into power consumption group 3. When one commutes by an electric vehicle, and the other works at home, the user is classified into power consumption group 4. When one commutes by train, and the other works at home, the user is classified into power consumption group 5. When the commuting style in a single-income couple is commuting by train, the user is classified into power consumption group 6. When commuting by an electric vehicle, the user is classified into power consumption group 7. When working at home, the user is classified into power consumption group 8.

Figure 9B:
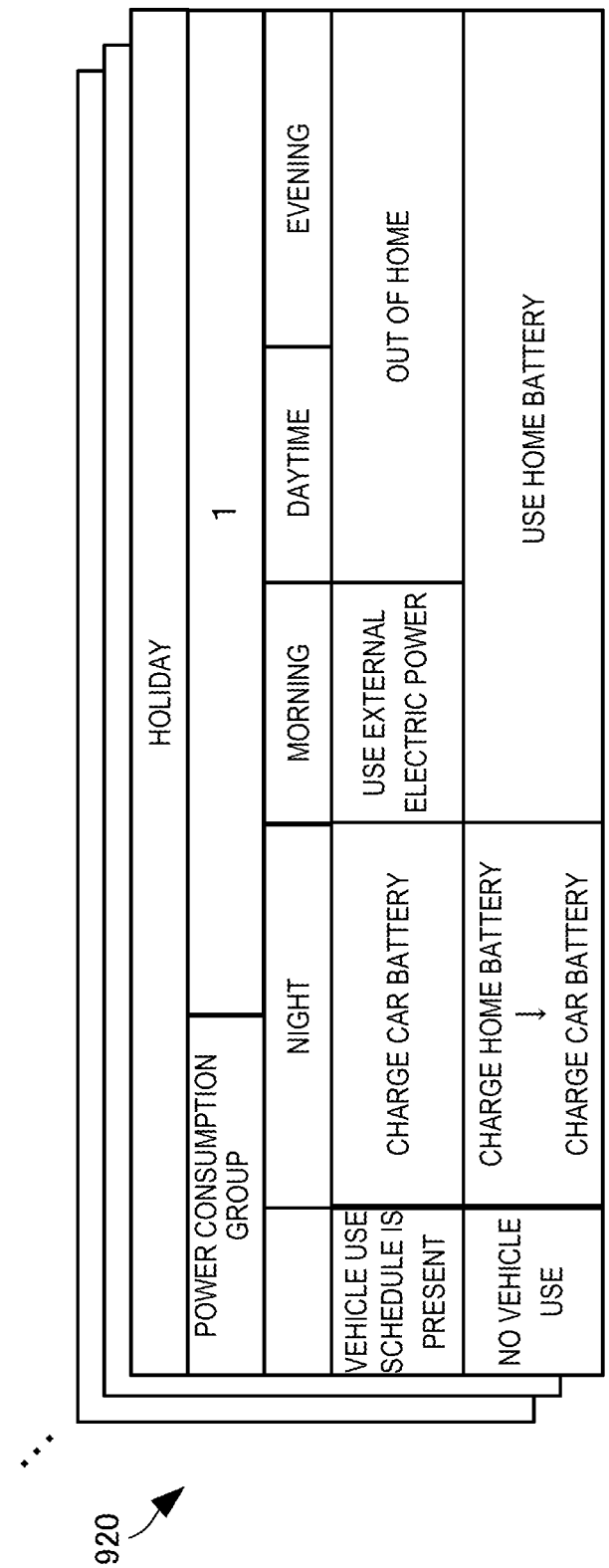
FIG. 9B is a table showing power consumption and charge models according to the second embodiment of the present invention.

Examples of life styles of power consumption groups 1 to 8 shown in FIG. 8 will be described with reference to FIGS. 9A to 9D. FIG. 9A shows a table 910 representing power usage and charge models to the batteries based on the weekday life style of a double-income family in power consumption groups 1 to 5. In power consumption group 1, both the husband and wife commute by trains. Hence, the car battery 221 need not be charged on weekdays, and the home battery 240 is charged. Note that even when the car battery 221 need not be charged, it may be charged with some electric energy to allow the user to go shopping in the neighborhood or pick up/drop off someone at the nearest station. In the morning, electric power in the home battery 240 charged at night is used. There is no power consumption during daytime. In the evening, electric power stored in the home battery 240 is used.

In power consumption group 2, since both the husband and wife commute by the electric vehicle, the car battery 221 is charged during nighttime. In group 2, since priority is given to charging the electric vehicle 220, it may be impossible to sufficiently charge the home battery 240 during the night only. Hence, in the morning, electric power stored in the home battery 240 is used if it remains. If no electric power remains, external electric power from the power company 410 or the like is used. There is no power consumption during daytime. In the evening, electric power in the car battery 221 is used if it remains. If no electric power remains, the home battery 240 is used. If no electric power remains in the home battery 240, either, external electric power is used.

In power consumption group 3, one of the couple commutes by the electric vehicle 220. Hence, the car battery 221 is charged during the night. In this group, one electric vehicle 220 is charged at night, and the rest of power use timings and the charging order at night is the same as in power consumption group 2.

In power consumption group 4, one commutes by the electric vehicle 220, and the other works at home. Hence, the car battery 221 is charged during the night, and after that, the home battery 240 is charged. Electric power in the home battery 240 is used during daytime. In group 4 as well, only one electric vehicle 220 is charged. However, since the home battery 240 need also be charged because of working at home, the battery charge amount is larger than in power consumption group 3. The home battery 240 is used in the morning and daytime. The home battery 240 is used in the evening as well. The car battery 221 may be used.

In power consumption group 5, one commutes by train, and the other works at home. Since electric power is consumed in the home during daytime, the home battery 240 is charged at night. In group 5, basically, charging the home battery 240 suffices, and charging the car battery 221 need not taken into consideration. The home battery 240 is used from morning to evening. When the electric power runs out, external electric power is used.

FIG. 9B shows a table 920 representing the holiday life style of power consumption group 1. Note that the power usage and charge models on the holiday will divisionally be explained concerning a case where the electric vehicle 220 is used and a case where not used. Since there exist a plurality of power usage and charge models on the holiday, the example shown in FIG. 9B is merely an example.

When the electric vehicle 220 is to be used, the car battery 221 is charged during the night. In the morning, external electric power is used. The user goes out by the electric vehicle 220 from morning to evening. On the other hand, when the electric vehicle 220 is not to be used, electric power in the home battery 240 charged during nighttime in the previous day is used from morning to evening. When the electric power runs out, external electric power is used.

FIG. 9C shows a table 930 representing power usage and charge models to the batteries based on the weekday life style of a single-income family in power consumption groups 6 to 8.

In power consumption group 6, the user commutes by a train. Hence, the home battery 240 is charged during nighttime. Electric power in the home battery 240 charged during nighttime is used from morning to evening. When the electric power in the home battery 240 runs out in the evening, external electric power is used.

In power consumption group 7, the user commutes by an electric vehicle. Hence, the car battery 221 is charged at night, and after that, the home battery 240 is charged. Electric power in the home battery 240 is used in the morning and daytime. In the evening, electric power remaining in the car battery 221 is used. When the electric power runs out, the home battery 240 is used, and external electric power is then used.

In power consumption group 8, the user works at home. Hence, the home battery 240 is charged at night. Basically, electric power in the home battery 240 is used in the morning, daytime, and evening. When the electric power runs out, external electric power is used.

FIG. 9D shows a table 940 representing the holiday life style of power consumption group 6. Note that the power usage and charge models on the holiday will divisionally be explained concerning a case where the electric vehicle 220 is used and a case where not used. Since there exist a plurality of power usage and charge models on the holiday, the example shown in FIG. 9D is merely an example.

When the electric vehicle 220 is to be used, the car battery 221 is charged during the night to use the electric vehicle 220 from morning. The user goes out by the electric vehicle 220 from morning through daytime. In the evening, electric power in the car battery 221 is used if it remains. When the electric power runs out, external electric power is used.

On the other hand, when the electric vehicle 220 is not to be used, electric power in the home battery 240 charged during nighttime is used in the morning, daytime, and evening. When the electric power runs out, external electric power is used.

FIG. 9E shows a table 950 representing a driving record about the battery consumption of an electric vehicle of the same model as the electric vehicle 220. As a driving record about the battery consumption of model: Kato EV 2012, 7 km/KWh is shown as the mileage of the battery when driving an expressway. Such a driving record can be shared with specific friends or the circle of a microblog such as Twitter. The correspondence between driving and power consumption may be shared in the circle. The storage 316 shares a driving environment, data of battery use state, and the like as the driving record. This makes it possible to obtain information when a vehicle of the same model previously drove a road where the user has never driven and more accurately charge the car battery 221.

Here, the electric vehicle is limited to the same mode. However, a table representing the driving record of electric vehicles having the same performance may be generated. In this case, the storage 316 further accumulates a driving record about the battery consumption of an electric vehicle having the same driving capability as the electric vehicle of the user.

The determining unit 312 can determine necessary energy based on the thus accumulated driving record and driving schedule.

(Hardware Arrangement of Cloud Server)

Figure 10:
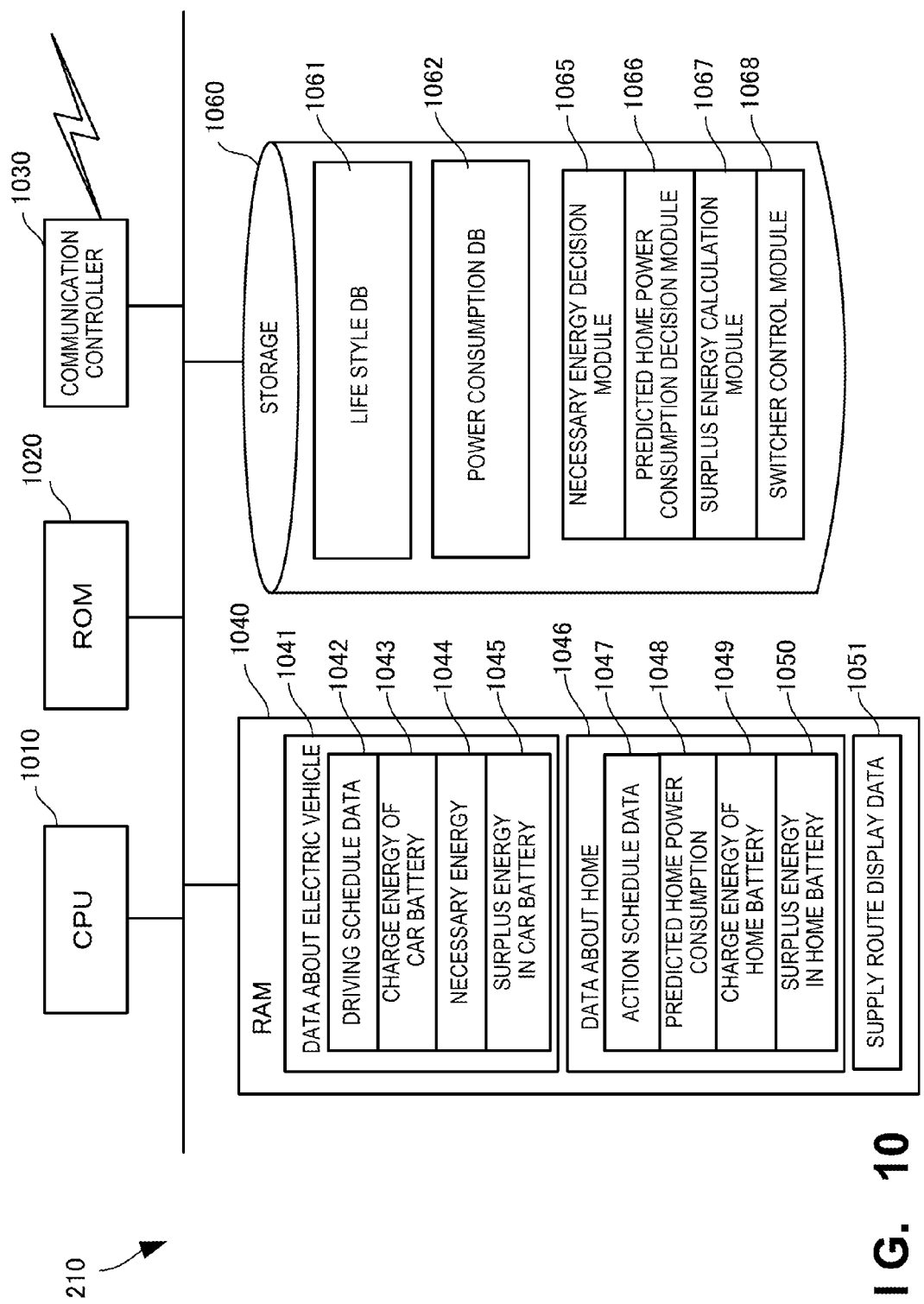
FIG. 10 is a block diagram showing the hardware arrangement of the cloud server according to the second embodiment of the present invention.

The internal arrangement of the cloud server 210 will be described with reference to FIG. 10. The cloud server 210 comprises a CPU (Central Processing Unit) 1010, a ROM (Read Only Memory) 1020, a communication controller 1030, a RAM (Random Access Memory) 1040, and a storage 1060. The CPU 1010 is a central processor, and executes various programs, thereby controlling the entire cloud server 210.

The ROM 1020 is a read only memory and stores various kinds of parameters and the like as well as a boot program to be executed by the CPU 1010 first. The RAM 1040 is a random access memory. The communication controller 1030 controls communication with the electric vehicle 220 and the home battery 240 via the network.

The RAM 1040 includes driving schedule data 1042, charge energy 1043 of the car battery, necessary energy 1044, and surplus energy 1045 of the car battery as data 1041 about the electric vehicle 220. The driving schedule data 1042 is the driving schedule of the electric vehicle 220, and includes a departure location, a destination, a transit location, and the like. The cloud server 210 may acquire the driving schedule from, for example, schedule information in a portable communication terminal serving as a user terminal. The charge energy 1043 of the car battery is energy with which the car battery 221 is charged and which is detected by the detector 313. The necessary energy 1044 is energy with which the car battery 221 should be charged based on the driving schedule data 1042 and which is determined by the determining unit 312. The surplus energy 1045 of the car battery is energy calculated by the calculator 314 based on the difference between the charge energy 1043 and the necessary energy 1044 of the car battery.

The RAM 1040 also includes action schedule data 1047, a predicted home power consumption 1048, charge energy 1049 of the home battery, and surplus energy 1050 of the home battery as data 1046 about the home. The action schedule data 1047 is data representing the schedule of use of the home appliances 250. The cloud server 210 may acquire the action schedule from, for example, schedule information in a portable communication terminal serving as a user terminal. The predicted home power consumption 1048 is energy determined by the determining unit 312 based on the schedule in the home. The charge energy 1049 of the home battery is energy with which the home battery 240 provided in the home is charged. The surplus energy 1050 of the home battery is energy calculated based on the difference between the charge energy 1049 of the home battery and the predicted home power consumption 1048.

Supply route display data 1051 is display data used to notify the user of the supply destination of the surplus energy 1045 of the car battery or the surplus energy 1050 of the home battery, as shown in FIGS. 3B and 3C.

The storage 1060 stores a life style database (DB) 1061, a power consumption DB 1062, a necessary energy decision module 1065, a predicted home power consumption decision module 1066, a surplus energy calculation module 1067, and a switcher control module 1068.

The life style DB 1061 includes a table 810 representing life styles. The life style DB 1061 also includes the table 910 representing double-income family power usage models (weekday), the table 920 representing double-income family power usage models (holiday), the table 930 representing single-income family power usage models (weekday), and the table 940 representing single-income family power usage models (holiday). The table 810 representing life styles shows power consumption grouping based on whether the life style in the home is a double income or a single income, as shown in FIG. 8. The table 910 representing double-income family power usage models (weekday) stores the power usage and charge models of double-income families in weekdays on a commuting style basis, as shown in FIG. 9A. The table 920 representing double-income family power usage models (holiday) stores the power usage and charge models of double-income families in holidays on a commuting style basis. These also apply to the table 930 representing single-income family power usage models (weekday) and the table 940 representing single-income family power usage models (holiday).

The necessary energy decision module 1065 causes the determining unit 312 to determine a necessary charge amount for the car battery 221 based on the driving schedule 1042. The predicted home power consumption decision module 1066 causes the determining unit 312 to determine the predicted home power consumption 1048 based on the schedule in the home. The surplus energy calculation module 1067 causes the calculator 314 to calculate the surplus energy of the car battery based on the difference between the charge energy and the necessary energy of the car battery. The switcher control module 1068 causes the controller 311 to select the supply destination of the surplus energy in the car battery 221 or the home battery 240.

With the above arrangement and operation, the information processing apparatus according to this embodiment switches the power supply route in the home in consideration of the action schedule of the user. It is therefore possible to store electric energy of an appropriate amount at an appropriate timing and efficiently use electricity.

Third Embodiment

Figure 11A:
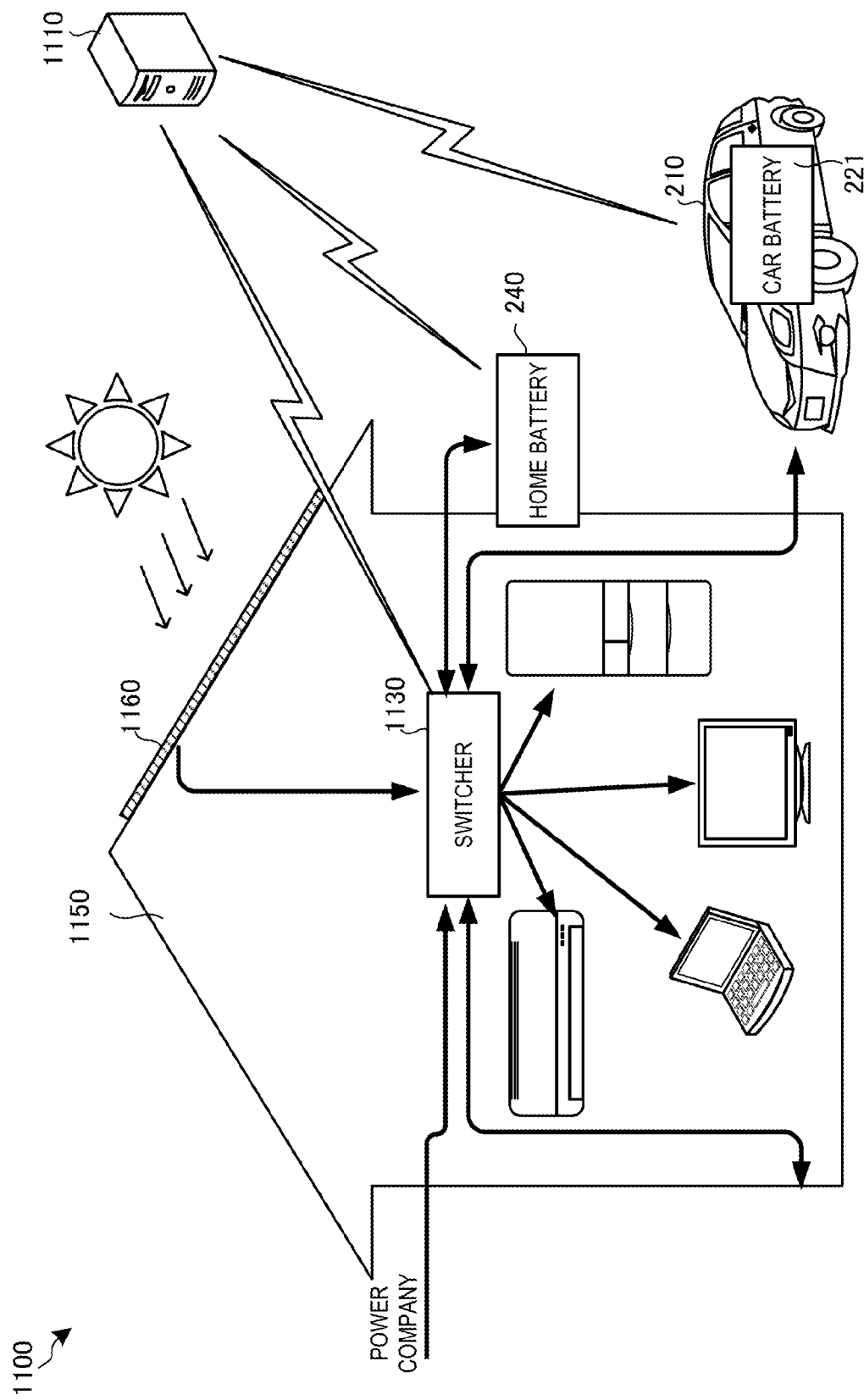
FIG. 11A is a view showing the outline of an information processing system including a cloud server according to the third embodiment of the present invention.
Figure 11B:
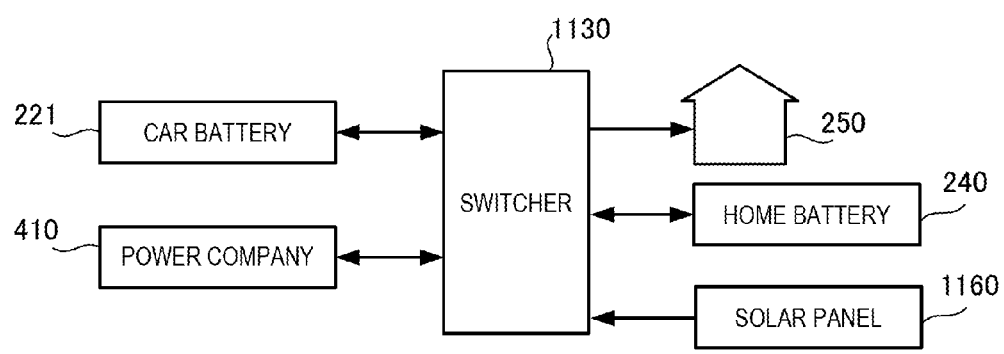
FIG. 11B is a view showing modeling of the switcher of the information processing system including the cloud server according to the third embodiment of the present invention.

An information processing system 1100 including a cloud server according to the third embodiment of the present invention will be described next with reference to FIGS. 11A to 11C. FIG. 11A is a view for explaining the outline of the information processing system 1100 including the cloud server according to this embodiment. The information processing system 1100 according to this embodiment is different from the second embodiment in that it includes a solar panel 1160. The rest of the components and operations is the same as in the second embodiment. Hence, the same reference numerals denote the same components and operations, and a detailed description thereof will be omitted.

A switcher 1130 determines a supply route including power supply from the solar panel 1160. The detailed arrangement of the switcher 1130 will be described with reference to FIGS. 11B and 11C. FIG. 11B is a model diagram showing the switching target of the switcher 1130. FIG. 11C is a view for explaining details of switching by the switcher 1130.

The switcher 1130 switches the supply route of electric power among a power company 410, a car battery 221, a home battery 240, home appliances 250, and the solar panel 1160. The solar panel 1160 is fixed as a supply source. However, since a route to sell electric power generated by the solar panel 1160 to the power company 410 is also considerable, the power company 410 is not fixed as a supply source, unlike FIG. 4. The car battery 221, the home battery 240, and the power company 410 can be both a supply source and a supply destination of electric power.

Figure 11C:
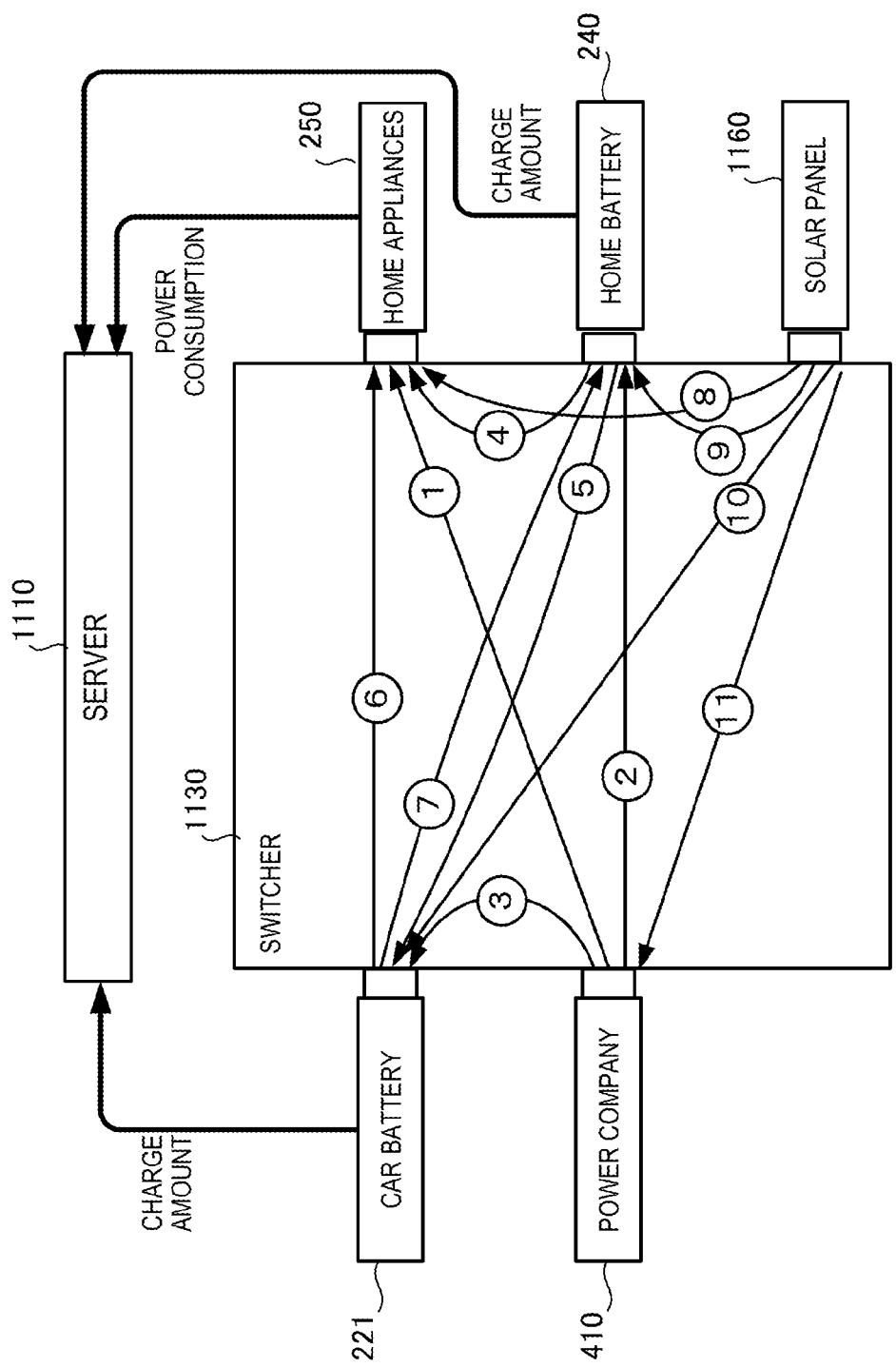
FIG. 11C is a view showing the power supply route of the information processing system including the cloud server according to the third embodiment of the present invention.

As shown in FIG. 11C, the switcher 1130 has 11 supply routes (1) to (11) and performs switching so as to select at least one of them. The supply route (1) is used to consume, in the home, electric power supplied from the power company 410. The supply route (2) is used to charge the home battery 240 with electric power supplied from the power company 410. The supply route (3) is used to charge the car battery 221 with electric power supplied from the power company 410. The supply route (4) is used to consume, in the home, electric power supplied from the home battery 240. The supply route (5) is used to charge the car battery 221 with electric power supplied from the home battery 240. The supply route (6) is used to consume, in the home, electric power supplied from the car battery 221. The supply route (7) is used to charge the home battery 240 with electric power supplied from the car battery 221. The supply route (8) is used to supply electric power generated by the solar panel 1160 directly to the home appliances 250. The supply route (9) is used to charge the home battery 240 using electric power generated by the solar panel 1160. The supply route (10) is used to charge the car battery 221 using electric power generated by the solar panel 1160. The supply route (11) is used to sell electric power generated by the solar panel 1160 to the power company 410.

The supply route (1) is selected, for example, during driving of the electric vehicle 220 in a state in which the home battery 240 is not charged with electric power, and the home appliances 250 need to be used.

The supply route (2) is selected, for example, at night in a state in which the home battery 240 is not charged with electric power, and the home appliances 250 are scheduled to be used in the next day.

The supply route (3) is selected, for example, at night in a state in which the car battery 221 is not charged with electric power, and the electric vehicle 220 is scheduled to be used in the next day.

The supply route (4) is selected, for example, in the daytime in a state in which the home battery 240 is charged with electric power, and the home appliances 250 need to be used.

The supply route (5) is selected, for example, at night in a state in which the home battery 240 is charged with electric power, the home appliances 250 are not scheduled to be used, and the electric vehicle 220 is scheduled to be used in the next day.

The supply route (6) is selected, for example, in the daytime in a state in which the electric vehicle 220 is not scheduled to be used, the home battery 240 is not charged with electric power, and the home appliances 250 need to be used.

The supply route (7) is selected, for example, in a state in which the electric vehicle 220 is scheduled to be used but not driven until battery exhaustion, and electric power is scheduled to be used even in the home during use of the electric vehicle 220.

The supply route (8) is selected, for example, in a state in which use of the car battery 221 is undesirable because the electric vehicle 220 is scheduled to be used, the home battery 240 is not charged with sufficient energy, and the power generation amount of the solar panel 1160 is sufficient.

The supply route (9) is selected, for example, in a state in which the power generation amount of the solar panel 1160 is sufficient and exceeds the consumption by the home appliances 250, and the electric vehicle 220 is not scheduled to be used or is being used.

The supply route (10) is selected, for example, in a state in which the power generation amount of the solar panel 1160 is sufficient, the home battery 240 is also charged with sufficient energy, and the electric vehicle 220 is scheduled to be used.

The supply route (11) is selected, for example, in a state in which the power generation amount of the solar panel 1160 is sufficient, the home battery 240 is also charged with sufficient energy, and the electric vehicle 220 is not scheduled to be used or is being used.

Note that a storage 316 accumulates data of a consumption of power which supplied to the home appliances 250 via the supply routes (1), (4), (6), and (8) together with the state (at-home status, date, day of week, weather, and the like). A determining unit 312 of a cloud server 1110 can determine the predicted power consumption in the home using the past power consumption data.

Figure 12:
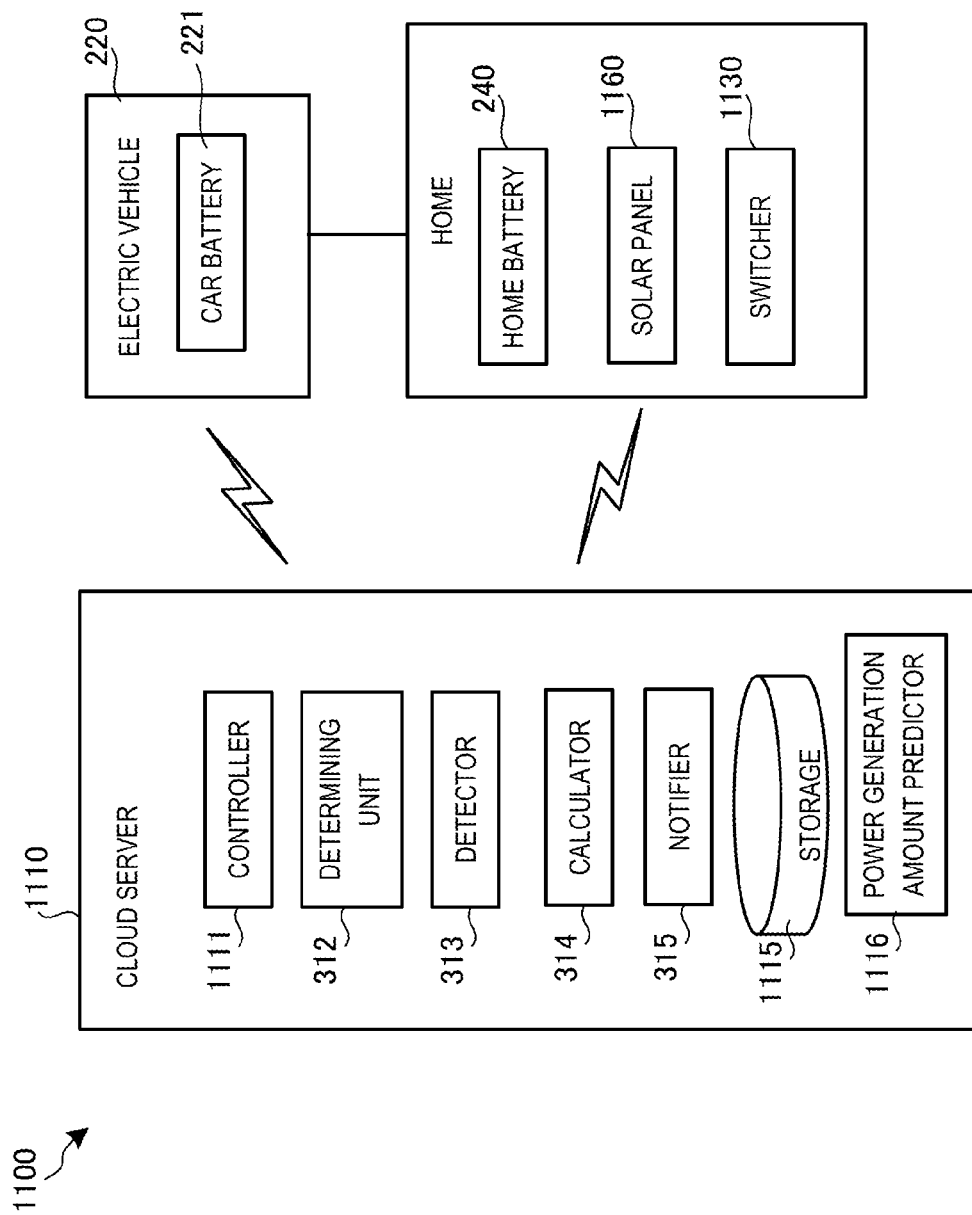
FIG. 12 is a block diagram showing the functional arrangement of the information processing system including the cloud server according to the third embodiment of the present invention.

FIG. 12 is a block diagram showing the arrangement of the cloud server 1110. The cloud server 1110 includes a power generation amount predictor 1116 in addition to the arrangement according to the second embodiment. The cloud server 1110 also includes storage 1115. The power generation amount predictor 1116 predicts the power generation amount of the solar panel 1160 based on a weather forecast, sunrise and sunset times, a forecast of sunshine duration, and the like.

The cloud server 1110 predicts the power generation amount of a photovoltaic power generation system provided in the home and controls the supply route of electric power in the home while selecting, based on the power generation amount, which one of electric power supplied from the power company and electric power supplied from the car battery 221 of the electric vehicle is to be consumed in the home.

As described above, according to this embodiment, even when the solar panel is added to the system, it is possible to determine an appropriate power supply route and efficiently use electricity.

Other Embodiments

Additionally, as shown in FIG. 13, mileage (driving distance per used energy) data of each model may be collected from many users. An average change in the mileage may thus be obtained and accumulated in the storage 316 of the cloud server 210. Necessary energy according to a user's driving schedule can be more accurately obtained using the stored average mileage.

Furthermore, as shown in FIG. 14, an average mileage for each individual who drives the electric vehicle 220 may be stored, and necessary energy according to a user's driving schedule may be obtained based on the average mileage of the individual.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The present invention is applicable to a system including a plurality of devices or a single apparatus. The present invention is also applicable even when an information processing program for implementing the functions of the embodiments is supplied to the system or apparatus directly or from a remote site. Hence, the present invention also incorporates the program installed in a computer to implement the functions of the present invention on the computer, a medium storing the program, and a WWW (World Wide Web) server that causes a user to download the program. Note that in the above embodiments, use in the home has been described as an example of a house. Use in a dormitory or the like is also considerable. The present invention is also usable in a public facility such as a school, a lodging facility such as a hotel, a business establishment such as a company, a factory, a hospital, and the like as well as a house.

This application claims the benefit of Japanese Patent Application No. 2012-123805 filed on May 30, 2012, which is hereby incorporated by reference herein in its entirety.

The invention claimed is:

1. An information processing apparatus comprising:
a controller that controls a supply route of electric power in a house;
a determining unit that determines, based on a driving schedule of an electric vehicle, necessary energy with which a car battery of the electric vehicle should be charged; and
a detector that detects first charge energy with which the car battery is charged, and a calculator that calculates surplus energy in the car battery based on a difference between the first charge energy and the necessary energy,
wherein said controller selects, based on the necessary energy and the first charge energy, which one of electric power supplied from a power company and electric power supplied from the car battery is to be consumed in the house, and
wherein said controller supplies, from the car battery, electric power corresponding to the calculated surplus energy for consumption in the house.

2. The information processing apparatus according to claim 1, wherein said determining unit further determines a predicted house power consumption based on an action schedule in the house, and
when the determined predicted house power consumption is not more than a predetermined amount, said controller leaves, in the car battery, the electric power corresponding to the calculated surplus energy.

3. The information processing apparatus according to claim 2, wherein said determining unit further determines the predicted house power consumption based on the action schedule in the house,
said detector further detects second charge energy with which a house battery provided in the house is charged, and
said controller selects, based on the predicted house power consumption and the second charge energy, whether to supply electric power with which the car battery is charged for consumption in the house or to charge the house battery.

4. The information processing apparatus according to claim 1, further comprising a notifier that notifies a user of the supply route of the electric power.

5. The information processing apparatus according to claim 1, further comprising an accumulator that accumulates a first driving record about consumption of a battery in an electric vehicle of the same model as the electric vehicle,
wherein said determining unit determines the necessary energy based on the driving schedule and the accumulated first driving record.

6. The information processing apparatus according to claim 5, wherein said accumulator further accumulates a second driving record about consumption of a battery in an electric vehicle having the same driving capability as the electric vehicle, and
said determining unit determines the necessary energy based on the driving schedule and the accumulated second driving record.

7. The information processing apparatus according to claim 1, further comprising a power generation amount predictor that predicts a power generation amount of a photovoltaic power generation system provided in the house,
wherein said controller controls the supply route of the electric power in the house while selecting, based on the power generation amount, which one of the electric power supplied from the power company and the electric power supplied from the car battery of the electric vehicle is to be consumed in the house.

8. An information processing method comprising:
determining, based on a driving schedule of an electric vehicle, necessary energy with which a car battery should be charged;
detecting first charge energy with which the car battery is charged;
controlling a supply route of electric power in a house by selecting, based on the necessary energy and the first charge energy, which one of electric power supplied from a power company and electric power supplied from the car battery of the electric vehicle is to be consumed in the house; and
calculating surplus energy in the car battery based on a difference between the first charge energy and the necessary energy,
wherein on controlling, it is determined based on the necessary energy and the first charge energy, which one of electric power supplied from a power company and electric power supplied from the car battery is to be consumed in the house and wherein electric power corresponding to the calculated surplus energy for consumption in the house is supplied from the car battery.

9. A non-transitory computer readable medium storing an information processing program that causes a computer to execute a method comprising:
determining, based on a driving schedule of an electric vehicle, necessary energy with which a car battery should be charged;
detecting first charge energy with which the car battery is charged; and
controlling a supply route of electric power in a house by selecting, based on the necessary energy and the first charge energy, which one of electric power supplied from a power company and electric power supplied from the car battery of the electric vehicle is to be consumed in the house; and calculating surplus energy in the car battery based on a difference between the first charge energy and the necessary energy, wherein on controlling, it is determined based on the necessary energy and the first charge energy, which one of electric power supplied from a power company and electric power supplied from the car battery is to be consumed in the house and wherein electric power corresponding to the calculated surplus energy for consumption in the house is supplied from the car battery.

10. An information processing system comprising:
a switching apparatus that is installed in a house and switches a supply route of electric power to be consumed in the house to one of power sources including at least a car battery of an electric vehicle and electric power supplied from a power company; and
an information processing apparatus,
said information processing apparatus comprising:
a determining unit that determines, based on a driving schedule of the electric vehicle, necessary energy with which the car battery should be charged;
a detector that detects first charge energy with which the car battery is charged;
a calculator that calculates surplus energy in the car battery based on a difference between the first charge energy and the necessary energy; and
a controller that selects, based on the necessary energy and the first charge energy, which one of electric power corresponding to the surplus energy supplied from the car battery and electric power supplied from the outside of the house is to be consumed in the house and controls the supply route of the electric power in the house.

11. A control method of an information processing system, the method comprising:
determining, based on a driving schedule of an electric vehicle, necessary energy with which a car battery should be charged;
detecting first charge energy with which the car battery is charged;
calculating surplus energy in the car battery based on a difference between the first charge energy and the necessary energy; and
controlling a supply route of electric power by selecting, based on the surplus energy, which one of electric power corresponding to the surplus energy supplied from the car battery and electric power supplied from outside of a house is to be consumed in the house and controlling a switching apparatus installed in the house.

* * * * *